June 16, 1959 H. C. GOODRICH 2,891,192

SAWTOOTH WAVE GENERATOR

Filed Sept. 30, 1955

INVENTOR.
HUNTER C. GOODRICH
BY H. W. Newton
ATTORNEY

United States Patent Office 2,891,192

Patented June 16, 1959

2,891,192

SAWTOOTH WAVE GENERATOR

Hunter C. Goodrich, Collingswood, N.J., assignor to Radio Corporation of America, a corporation of Delaware Application September 30, 1955, Serial No. 537,767

9 Claims. (Cl. 315—27)

Figure 1:
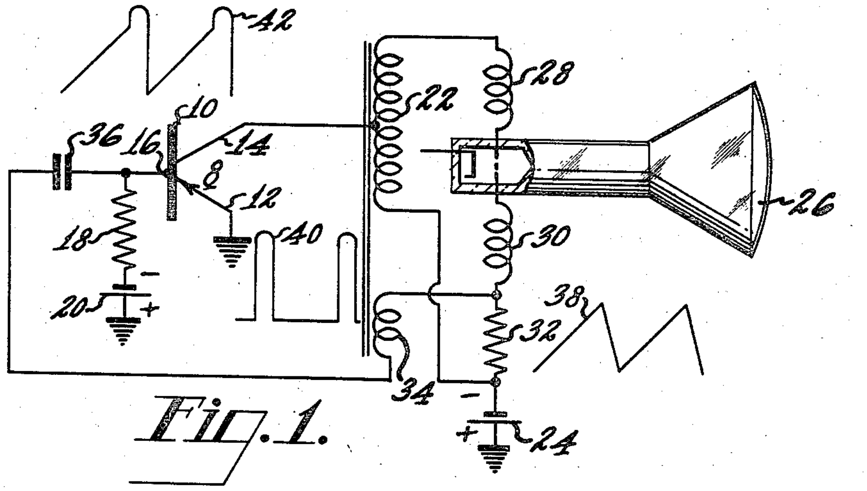

This invention relates in general to semi-conductor oscillator circuits and in particular to oscillator circuits utilizing transistors for producing sawtooth waveforms.

A sawtooth voltage wave, in general, is that produced by a voltage that increases at a substantially constant rate for some time interval followed by a rapid drop in value of the voltage. To provide such a waveform, many circuit arrangements employing both electron tubes and transistors have been devised. Such circuits may be useful for many different circuit applications, such as, for example, in the deflection circuits of television cameras and receivers or in oscilloscopes. A sawtooth wave generator may be of the type which must be triggered by the application of external pulses or may be of the self-oscillating type. The self-oscillating type is often preferred for some circuit applications. In either type, however, and for many different circuit applications, it is desired or required that the sloping part of the sawtooth wave increase in a linear manner with time. Other desired characteristics of such a circuit include simplicity of the circuit connections and components used and efficient and reliable circuit operation.

It is, accordingly, an object of the present invention to provide an improved sawtooth wave generator employing semi-conductor devices such as transistors, for providing a substantially linear sawtooth wave.

It is another object of the present invention to provide an improved self-oscillating semi-conductor sawtooth wave generator circuit which is reliable and efficient in operation.

It is a still further object of the present invention to provide an improved self-oscillating sawtooth wave generator circuit utilizing a single transistor for simplified circuit construction and highly efficient circuit operation.

These and further objects and advantages of the present invention are achieved by a circuit arrangement which includes a transistor, the collector electrode of which is serially connected with an inductor and a resistor. The inductor would, for cathode ray tube deflection applications, be the magnetic deflection yoke of the cathode ray tube. The transistor is initially biased into saturation and as current builds up linearly across the inductor a positive voltage is developed across the resistor which is coupled through a feedback path to the base of a transistor to decrease its collector current. A separate inductive winding in the feedback path provides positive feedback for the oscillator and cuts off the transistor. The cycle then repeats as the transistor is biased into saturation to provide a series of substantially linear sawtooth waves.

Figure 2:
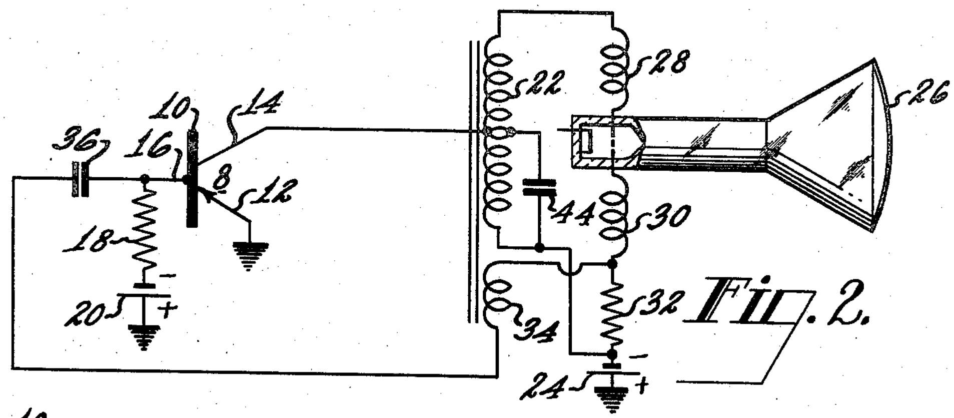
Figure 3:
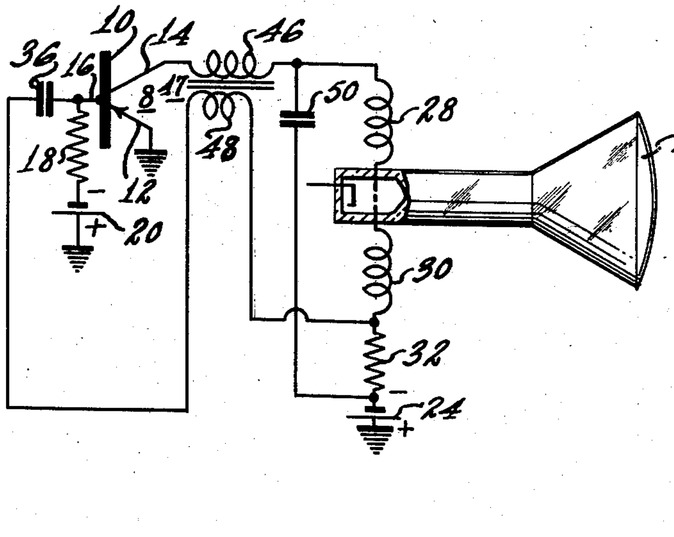

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1, 2 and 3 are schematic circuit diagrams of semi-conductor oscillator circuits embodying the invention and connected to provide sawtooth waveforms which are suitable for use in the deflection circuits of cathode ray tubes.

Referring now to the drawing, wherein like parts are indicated by like reference numerals throughout the figures, and referring particularly to Figure 1, a transistor 8 may be considered to be, by way of example, a junction transistor of the P–N–P type and includes a semi-conductive body 10 with which an emitter 12, a collector 14 and a base electrode 16 are cooperatively associated in a well known manner. While the transistor 8 is of the junction type, it may be of any other suitable type having characteristics which are similar to those of the junction type transistor. In addition, while the transistor 8 has been chosen to be of N type conductivity for the purposes of explanation, it should be understood that it could be of P type conductivity as, for example, an N–P–N junction transistor, if the polarity of the biasing sources used were reversed. The transistor 8 is connected in the so-called common emitter configuration, the emitter 12 being connected directly to a point of reference potential or ground for the circuit and being common to the input and output circuits. The base 16 serves as the input electrode and is connected through a resistor 18 to the negative terminal of a source of direct current potential such as illustrated by the battery 20. The resistor 18 and the battery 20 are chosen so as to normally bias the transistor 8 into saturation, that is the operating point at which the collector voltage is substantially zero.

The collector 14 of the transistor 8 is connected to a tap on an inductor 22, the lower end of which is connected to the negative terminal of a source of direct current biasing voltage such as illustrated by the battery 24. The tapped inductor 22 may be considered to be an autotransformer. The upper end of the inductor 22 is connected to one end of an inductive winding such as one set of deflection windings of the electromagnetic deflection yoke of a cathode ray tube or kinescope 26 of a television receiving system. For purposes of illustration, the deflection winding has been separated into two inductive windings 28 and 30. While intended primarily for horizontal deflection applications, the present invention is also applicable to vertical deflection of the electron beam of a cathode ray tube. The lower end of the inductive winding 30 is connected to the negative terminal of the battery 24 through a resistor 32 having a relatively small resistance.

To provide a feedback path for the oscillator circuit for bringing the transistor out of the saturation state and for providing positive or regenerative feedback for sustaining continuous oscillation, in accordance with the invention, the junction of the resistor 32 and the inductive winding 30 is coupled through a pickup winding 34 of relatively few turns and a coupling capacitor 36 to the base 16 of the transistor 8. The pickup winding 34 is in inductive coupling relation to the tapped winding 22.

In operation, the transistor 8 is initially in a state of collector current saturation due to the base bias provided by the battery 20. The collector of the transistor is at this point substantially shunted to ground potential, which places a constant voltage across the inductors 28 and 30 which is equal to the voltage of the battery 24 multiplied by the transformation ratio of the autotransformer comprising the tapped inductor 22. Current thus flows from the collector 14 through the inductive windings 28 and 30 to the negative terminal of the battery 24 and will increase substantially linearly with time. This increase in current produces a sawtooth of voltage across the resistor 32 as indicated by the voltage waveform 38. The positive sawtooth voltage so developed is coupled through the winding 34 and the coupling capacitor 36 to the base 16 of the transistor 8. Eventually, the voltage across the resistor 32 which is applied to the base 16 is sufficiently positive to bring the transistor 8 out of the saturation condition and into the normal amplifying condition. At this point the collector current of the transistor 8 begins to decrease. The pickup winding 34 in the feedback path, as was mentioned hereinbefore, is inductively coupled with the tapped winding 22. Accordingly, as the rate of change of the current varies in the winding 22, a positive voltage pulse is induced in the winding 34 as shown by the waveform 40. This positive flyback pulse produces positive feedback and the collector current of the transistor 8 is rapidly reduced to zero or substantially zero. The voltage waveform which is applied to the base 16 is indicated at 42. The voltage across the windings 28 and 30 corresponding to the deflection windings of the kinescope 26 forms a negative flyback pulse when the collector current cuts off. After cutoff, the oscillatory cycle continues at a rate determined by the resonant frequency of the collector circuit until the transistor 8 is again in the saturated state. Since in saturation the transistor 8 has no gain, oscillation due to feedback winding 34 ceases, and the cycle repeats as the collector current again increases linearly.

While it will be understood that the circuit specifications may vary according to the design for any particular application, the following circuit specifications are included for the circuit of Figure 1 by way of example only:

| | |
|---|---|
| Capacitor 36 | 100 microfarads. |
| Inductors 28 and 30 | 1 millihenry (total). |
| Resistors 18 and 32 | 47 and 1.5 ohms respectively. |
| Batteries 20 and 24 | 1.5 and 10 volts respectively. |

As described, it is seen that self-oscillating sawtooth wave generators are provided in accordance with the teachings of the invention which utilize relatively few circuit components and relatively simple circuit connections. The transistor 8 in effect acts as a switch. High efficiency is obtainable because the power dissipation in the transistor is extremely low. This arises from the fact that the transistor 8 is either saturated, corresponding to a condition of no collector voltage, or it is open, corresponding to a condition of no collecter current. Moreover, the circuit is capable of providing a sawtooth voltage waveform which is substantially linear.

To increase the oscillator efficiency even more, a circuit of the type illustrated in Figure 2 may be used, reference to which is now made. The circuit illustrated in Figure 2 is identical to the one illustrated in Figure 1 with a single exception, that is a capacitor 44 is connected from a tap which may correspond to the center point of the inductor 22 to the negative terminal of the collector biasing battery 24. The capacitor 44 serves to raise the oscillator efficiency by storing, during fly-back, the energy contained in the inductors 28 and 30 and returning the energy to these inductors at the conclusion of fly-back in the form of a current which is opposite in direction to that flowing just prior to fly-back. The addition of capacitor 44 shifts the zero axis of the current or voltage waveform 38 from the lower extremity of the sawtooth to a level near its center. Energy is thus returned to the collector supply battery 24 during the first half of the linear portion of the scanning cycle. For this operation currents pass through transistor 10 bidirectionally so that electrodes 12 and 14 function alternately as collector and emitter. In this case transistor 10 is preferably a symmetrical transistor which has substantially equal gains regardless of which of electrode 12 and 14 is functioning as an emitter and which as a collector. Except for the shift in D.C. axis, the circuit illustrated in Figure 2 operates in a manner substantially identical to the circuit illustrated in Figure 1.

In the embodiment of the invention illustrated in Figure 3, the collector 14 of the transistor 8 is connected through the primary winding 46 of a transformer 47 to the output windings 28 and 30 corresponding, for example, to one set of deflection windings of the kinescope 26. The secondary winding 48 of the transformer 47 is included, in a manner similar to the pickup winding 34, in the feedback path which couples the junction of the output winding 30 and the resistor 32 to the base 16 of the transistor 8. A capacitor 50 is connected in parallel with the output windings 28 and 30 and the resistor 32. The circuit illustrated in Figure 3 is otherwise identical to the one illustrated in Figures 1 and 2.

In operation, the circuit illustrated in Figure 3 is substantially similar to the one illustrated in Figure 1. Thus the positive sawtooth wave developed across the resistor 32 is coupled to the base 16 of the transistor 8 which was initially biased into saturation. This decreases the collector current and the positive voltage pulse which is developed across the winding 48 cuts the transistor rapidly off. This cycle then repeats. The energy stored in the windings 28 and 30 discharges through the capacitor 50 when the transistor 8 is taken out of saturation by the application of a positive wave to its base by virtue of the feedback connection from the upper end of the resistor 32 to the base 16.

The electrode 12 of the transistor has been referred to as an emitter and the electrode 14 as a collector in each of the embodiments of the invention described. Since current flows in both directions in the transistor, however, the designation of either electrode as a collector or an emitter is essentially arbitrary. Thus the reference to the electrode 12 as an emitter and the electrode 14 as a collector should be considered to be for the sake of convenience and in most cases, particularly where the transistors used are symmetrical, as in Figure 2, the emitter and collector electrodes could be interchanged with no change in the operation of the circuits.

Substantially linear sawtooth waves are obtainable in accordance with the invention with highly efficient circuit operation and relatively small circuit connections. While useful wherever sawtooth waves are required, the circuits of the present invention should particularly be useful in deflection systems associated with the operation of cathode ray tubes such as for television receiver applications. In this connection, it may be noted that whereas all of the circuits described are self-excited sawtooth wave generators, their operation is readily susceptible to synchronization with some external source or wave, as by the application of suitable synchronizing pulses to the respective base electrodes in each of these circuits. In addition, the frequency of oscillation is easily varied by varying the voltage of either the battery 20 or the battery 24, the resistance of the resistor 32 or the inductance of the inductor 22. For circuit applications where a narrow pulse is needed, an output winding may be coupled with the inductor 22 in Figures 1 and 2 or the inductor 46 in Figure 3 from which a series of narrow pulses may be derived.

What is claimed is:

1. In a cathode ray tube deflection system, the combination with a transistor having a base, an emitter and a collector electrode, of means providing biasing potentials for said transistor effectively connected between said collector and base electrodes to normally bias said transistor into saturation, transformer means having a first and a second winding, means connecting said first winding with said collector electrode, cathode ray tube electromagnetic deflection means and a resistor serially connected with said first winding to provide a conductive output path for collector current flow of said transistor, feedback circuit means coupled from the junction of said deflection means and said resistor to said base electrode to provide a potential on the base electrode of a polarity to reduce the collector current flow of said transistor, and means including said second winding in said feedback circuit to provide coupling between said collector and base electrodes to render said transistor substantially non-conductive in response to collector current variations.

2. A cathode ray tube deflection system as defined in claim 1, wherein a storage capacitor is connected in parallel with said electromagnetic deflection means and said resistor.

3. In a cathode ray tube deflection system, the combination with a transistor having a base, an emitter and a collector electrode, of means providing biasing potentials for said transistor effectively connected between said collector and base electrodes to normally bias said transistor into saturation, cathode ray tube electromagnetic deflection means and a resistor serially connected between said collector electrode and said first-named means and providing a direct current conductive output path for the collector current flow of said transistor, feedback circuit means coupled from the junction of said deflection means and said resistor to said base electrode to provide a potential on the base electrode of a polarity to decrease the collector current flow of said transistor, and means in said feedback circuit providing coupling between said collector and base electrodes to render said transistor substantially non-conductive in response to the rate of change of collector current of said transistor.

4. In a cathode ray tube deflection system, the combination with a transistor having a base, an emitter and a collector electrode, of means providing biasing potentials for said transistors effectively connected between said collector and base electrodes to normally bias said transistor into saturation, an autotransformer having a winding including an intermediate tap, means connecting said collector electrode with said tap, cathode ray tube electromagnetic deflection means and a resistor serially connected with a portion of said autotransformer winding and said collector electrode to provide a conductive path for the collector current flow of said transistor, feedback circuit means coupled from the junction of said deflection means and said resistor to said base electrode to provide a potential on said base electrode of a polarity to vary the collector current flow of said transistor, and means including an inductor in inductive coupling relationship to said autotransformer winding included in said feedback circuit to provide coupling between said collector and base electrodes to render said transistor substantially non-conductive in response to collector current variations.

5. A cathode ray tube deflection system as defined in claim 4, wherein a storage capacitor is serially connected between said tap and the end of the said resistor remote from said deflection means.

6. A self-oscillating sawtooth wave generator comprising, in combination, a transistor including an input, an output, and a common electrode, output circuit means including an inductive load element connected with said output electrode and responsive to output current flow of said transistor to provide a substantially linear increase of current flow through said load element, means including a resistor having a small resistance value and responsive to output current flow of said transistor to develop a voltage of proper magnitude and polarity to reduce output current flow of said transistor, and means coupling said resistor with said input electrode to apply said voltage thereto to reduce output current flow of said transistor, said last named means including a feedback winding coupled with said output circuit means and responsive to a reduction of output current flow to provide voltage feedback to said input electrode for cutting off output current flow of said transistor.

7. A self-oscillating sawtooth wave generator comprising, in combination, a transistor including a base, an emitter, and a collector electrode, means for applying biasing potentials to said transistor of a magnitude to initially provide collector current saturation, output circuit means including an inductive load element connected with said collector electrode and responsive to collector current flow to provide a substantially linear increase of current flow through said load element, means including a resistor responsive to collector current flow of said transistor to develop a voltage of proper magnitude and polarity to reduce collector current flow of said transistor, and means coupling said resistor with said base electrode to apply said voltage thereto to reduce collector current flow of said transistor, said last named means including a feedback winding coupled with said output circuit means and responsive to a reduction of output current flow to provide voltage feedback to said base electrode for cutting off collector current flow of said transistor.

8. A self-oscillating sawtooth wave generator comprising, in combination, a transistor including a base, an emitter, and a collector electrode, means for applying biasing potentials to said transistor of a magnitude to initially provide collector current saturation, transformer means including a primary winding and a secondary winding, output circuit means including said primary winding and an inductive load element connected with said collector electrode and responsive to collector current flow to provide a substantially linear increase of current flow through said load element, means including a resistor having a small resistance value and responsive to collector current flow of said transistor to develop a voltage of proper magnitude and polarity to reduce collector current flow of said transistor, and means including said secondary winding connecting said resistor with said base electrode to apply said voltage thereto to reduce collector current flow of said transistor, said secondary winding being responsive to a reduction of collector current flow to provide voltage feedback to said base electrode for cutting off collector current flow of said transistor.

9. A self-oscillating sawtooth wave generator for television deflection systems comprising, in combination, a transistor including an input, an output, and a common electrode, means for applying biasing potentials to said transistor of a magnitude to initially provide output current saturation, output circuit means including a deflection winding connected with said output electrode and responsive to output current flow to provide a substantially linear increase of current flow through said deflection winding, means including a resistor having a small resistance value and connected in series with said deflection winding and said output electrode and responsive to output current flow of said transistor to develop a voltage of proper magnitude and polarity to reduce output current flow of said transistor, and means connecting said resistor with said input electrode to apply said voltage thereto to reduce output current flow of said transistor, said last named means including a feedback winding coupled with said output circuit means and responsive to a reduction of output current flow to provide voltage feedback to said input electrode for cutting off output current flow of said transistor.

References Cited in the file of this patent

UNITED STATES PATENTS

| | | |
|---|---|---|
| 2,647,957 | Mallinckrodt | Aug. 4, 1953 |
| 2,666,817 | Raisbeck et al. | Jan. 19, 1954 |
| 2,731,567 | Sziklai | Jan. 17, 1956 |

OTHER REFERENCES

Herzog and Lohman: "Portable Receiver," Radio Electronics, January 1955.